United States Patent
Goldbach et al.

(10) Patent No.: US 7,041,568 B2
(45) Date of Patent: May 9, 2006

(54) METHOD FOR THE PRODUCTION OF A SELF-ADJUSTED STRUCTURE ON A SEMICONDUCTOR WAFER

(75) Inventors: Matthias Goldbach, Dresden (DE); Thomas Hecht, Dresden (DE); Jörn Lützen, Dresden (DE); Bernhard Sell, Portland, OR (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/485,307

(22) PCT Filed: Jul. 18, 2002

(86) PCT No.: PCT/DE02/02651

§ 371 (c)(1),
(2), (4) Date: Aug. 13, 2004

(87) PCT Pub. No.: WO03/017342

PCT Pub. Date: Feb. 27, 2003

(65) Prior Publication Data

US 2004/0259032 A1    Dec. 23, 2004

(51) Int. Cl.
*H01L 21/20* (2006.01)

(52) U.S. Cl. ............... 438/387; 438/778; 438/779; 438/671

(58) Field of Classification Search ............... 438/584, 438/597, 666, 669, 671–672, 758, 778, 795, 438/387

See application file for complete search history.

(56) References Cited

U.S. PATENT DOCUMENTS

| | | |
|---|---|---|
| 5,879,866 A | 3/1999 | Starikov et al. |
| 5,935,763 A | 8/1999 | Caterer et al. |
| 5,981,150 A | 11/1999 | Aoki et al. |
| 6,022,764 A | 2/2000 | Park et al. |
| 6,031,291 A | 2/2000 | Sato et al. |
| 6,080,654 A | 6/2000 | Manchester |
| 6,518,640 B1 * | 2/2003 | Suzuki et al. ............ 257/432 |
| 6,570,223 B1 * | 5/2003 | Machida et al. ......... 257/347 |
| 6,794,207 B1 * | 9/2004 | Hasegawa et al. ........ 438/17 |

FOREIGN PATENT DOCUMENTS

| | | |
|---|---|---|
| DE | 198 45 058 A1 | 4/2000 |
| EP | 0 083 397 A2 | 7/1983 |
| EP | 0 523 768 A2 | 1/1993 |

* cited by examiner

*Primary Examiner*—Zandra V. Smith
*Assistant Examiner*—Thanh Y. Tran
(74) *Attorney, Agent, or Firm*—Morrison & Foerster LLP

(57) ABSTRACT

A structure on a layer surface of the semiconductor wafer has at least one first area region (8, 9), which is reflective for electromagnetic radiation, and at least one second, essentially nonreflecting area region (10, 11, 12). A light-transmissive insulation layer (13) and a light-sensitive layer are produced on said layer surface. The electromagnetic radiation is directed onto the light-sensitive layer with an angle $\Theta$ of incidence and the structure of the layer surface is imaged with a lateral offset into the light-sensitive layer.

8 Claims, 6 Drawing Sheets

METHOD FOR THE PRODUCTION OF A SELF-ADJUSTED STRUCTURE ON A SEMICONDUCTOR WAFER

CLAIM FOR PRIORITY

This application claims priority to International Application No. PCT/DE02/02651, published in the German language on Feb. 27, 2003, which claims priority to German Application No. DE 101 37 830.0, filed in the German language on Aug. 2, 2001.

TECHNICAL FIELD OF THE INVENTION

The invention relates to a method for fabricating a self-aligned structure on a semiconductor wafer.

BACKGROUND OF THE INVENTION

The progress in semiconductor technology means that it is possible to fabricate integrated circuits with a very high integration level. The integration level ranges from VLSI (very large scale integration) through ULSI (ultra large scale integration) up to even higher packing densities. The capacity of a single semiconductor chip rises from formerly a few thousand components through a hundred thousand up to currently millions of components. If we consider DRAM (dynamic random access memories) components, for example, then the capacity of an individual chip of formerly 4 Mbit or 16 Mbit up to 256 Mbit or more can be achieved by virtue of the enormous integration level in fabrication.

Components in integrated circuits, such as transistors or capacitors, have to be miniaturized to an ever greater extent and adapted to the requirements of the integrated circuits. The rising packing density of integrated circuits and the associated miniaturization of the components represent a major challenge to the semiconductor process technology. Thus, during the fabrication of an element or a component of an integrated circuit, care must be taken to ensure that the electrical characteristic quantities and characteristics of the other components on the integrated circuit are not altered or influenced. This means that the fabrication of the components must be achieved with regard to a high packing density, a low generation of heat and a low energy consumption in conjunction with a high reliability and a long lifetime in the fabrication without at the same time having to accept a loss of quality in the function of the component. It is assumed here that these stipulations can be achieved by parallel further development and improvement in the photolithography, the etching processes, the deposition, the ion implantation and the thermal processes, that is to say the five essential aspects of semiconductor technology.

In a known method for fabricating a DRAM cell arrangement (DE 198 45 058 A1), first trenches running essentially parallel to one another are produced in a substrate. The first trenches are filled with isolating structures. By etching with the aid of a strip-type photoresist mask whose strips run transversely with respect to the first trenches, the substrate is etched selectively with respect to the isolating structures, with the result that depressions are produced. Areas of lower regions of the depressions are provided with a capacitor dielectric. A storage node of a storage capacitor is in each case produced in the lower regions of the depressions. Upper source/drain regions of the transistors are produced in such a way that they are in each case arranged between two mutually adjacent depressions and between mutually adjacent isolating structures, and adjoin a main area of the substrate.

Lower source/drain regions of the transistors in the substrate are formed in such a way that they are electrically connected to the storage nodes, with the result that in each case one of the transistors and one of the storage capacitors are connected in series and form a memory cell. By deposition and patterning with masks of conductive material, word lines are produced, which run transversely with respect to the isolating structures above the main area, and, adjoining them, gate electrodes of vertical transistors are produced, which are each arranged in one of the depressions and are electrically insulated from the storage nodes. An insulating layer is produced over the word lines. Insulating spacers are produced on sidewalls of the word lines by depositing material and etching it back. With the aid of a strip-type photoresist mask whose strips run essentially parallel to the isolating structures, etching is effected selectively with respect to the insulating layer and the spacers until the upper source/drain regions are uncovered.

In this case, in the known method, a disadvantage can be seen in the fact that, in the lithographic processes using masks, there is always the problem of the relative alignment ("overlay") of mask and structure on the wafer. Consequently, the alignment of mask and structure on the wafer becomes a greater problem with increasing miniaturization of the components.

Maskless patterning of a light-sensitive material on a substrate is disclosed in a further known method (U.S. Pat. No. 5,935,763). In this case, the substrate has regions with a different reflection behavior. In this case, a parallel beam of light rays is radiated perpendicularly onto the light-sensitive material. In this case, the incident light is reflected at the reflective regions and therefore radiated back into the light-sensitive material. As a result, the light-sensitive material is exposed perpendicularly above the reflective regions of the substrate and is removed by a later development step, thereby producing an opening in the light-sensitive material which is formed in a self-aligned manner vertically above the reflective region of the substrate.

One disadvantage of the known method can be seen in the fact that a desired structure can be imaged into the light-sensitive material only vertically above the structure represented in the substrate. A substrate structure can therefore be imaged only vertically and true to scale with a scale of 1:1.

SUMMARY OF THE INVENTION

The invention to provides a method for fabricating a self-aligned structure on a semiconductor wafer in which an imaging of the substrate structure into the light-sensitive material can be carried out in a manner offset with respect to the substrate structure.

In one embodiment of the invention, there is a method for fabricating a self-aligned structure on a semiconductor wafer, a structure is formed on a layer surface of the semiconductor wafer with at least one first area region, at which an electromagnetic radiation is reflected and at least one second area region, through which the electromagnetic radiation passes virtually in its entirety. A light-transmissive insulation layer is produced at least on the two area regions of the layer surface. A light-sensitive layer is in turn formed directly on said light-transmissive insulation layer. A parallel electromagnetic beam of rays is radiated onto an entire surface of the light-sensitive layer.

According to one embodiment of the invention, the parallel electro-magnetic beam of rays is radiated onto the surface of the light-sensitive layer with an angle Θ of incidence. In this case, the angle Θ of incidence is prescribed such that the structure of the layer surface is imaged with a lateral offset into the light-sensitive layer.

Hence, a structure on the layer surface of the semiconductor wafer can be imaged into the light-sensitive layer in a self-aligned manner and offset with respect to the structure of the layer surface. Therefore, an imaging can be carried out in an area-extended or -compressed manner.

In this case, it may be provided that the beam path of the electromagnetic radiation through the light-sensitive layer and the light-transmissive insulation layer is set by a refractive index $n_1$ of the insulation layer and/or a refractive index $n_2$ of the light-transmissive layer and/or by a layer thickness of the insulation layer and/or of the light-sensitive layer. Hence, the offset formation of the structure of the layer surface in the light-sensitive layer is set by a plurality of parameters. Depending on the requirement made of the imaging of the structure of the layer surface into the light-sensitive layer, it is thereby possible for one or more parameters to be selected and varied and, accordingly, to achieve fast and cost-effective imaging of the structure. Moreover, a great diversity of possibilities for imaging the structure of the layer surface into the light-sensitive layer is possible by changing the parameters. Consequently, a structure of the layer surface can be imaged not only in an offset manner but also, for example, in a length- and/or width-extended or -contracted manner in the light-sensitive layer.

It may also be provided that the layer surface is formed in a planar manner and the structure of the layer surface is imaged into the light-sensitive layer virtually true to scale and offset merely by a distance a horizontally and parallel with respect to the layer surface.

Therefore, a structure of the layer surface is formed virtually true to scale with a desired offset a.

It may also be provided that the light-sensitive layer is covered at least partly with a protection device and the incident electromagnetic radiation is reflected and/or absorbed at said protection device Hence, only partial regions of the layer surface are imaged into the light-sensitive layer.

BRIEF DESCRIPTION OF THE DRAWINGS

The invention is explained in detail below using exemplary embodiments with reference to the drawings, in which.

DETAILED DESCRIPTION OF THE INVENTION

Figure 1:
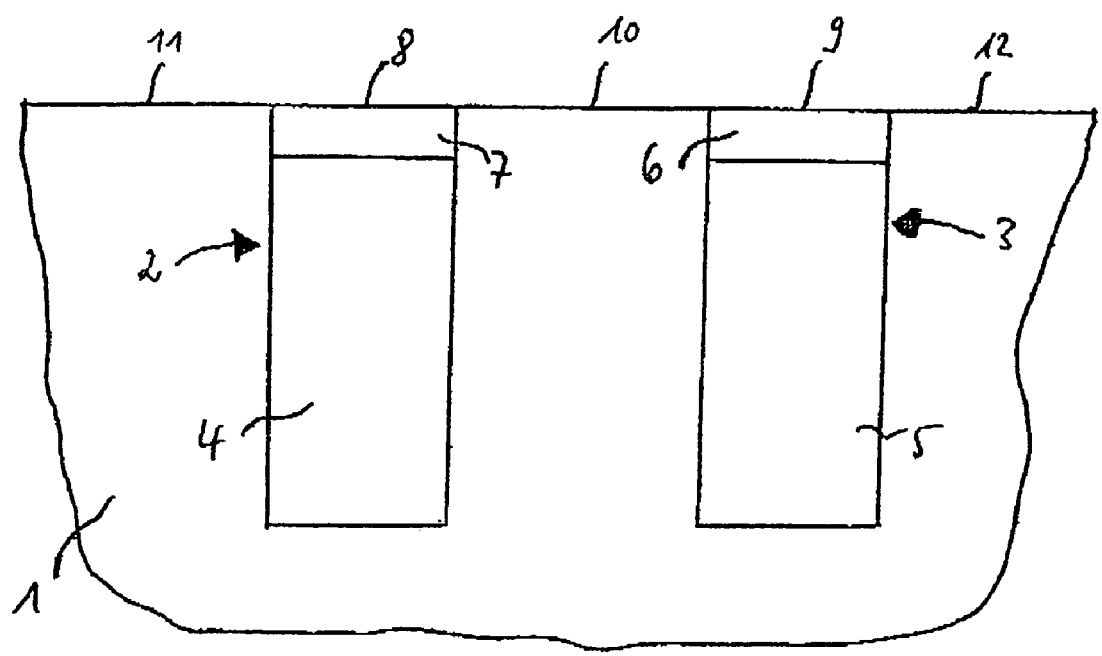
FIGS. 1–4 show the individual steps of a first embodiment of the fabrication of a self-aligned structure.
Figure 2:
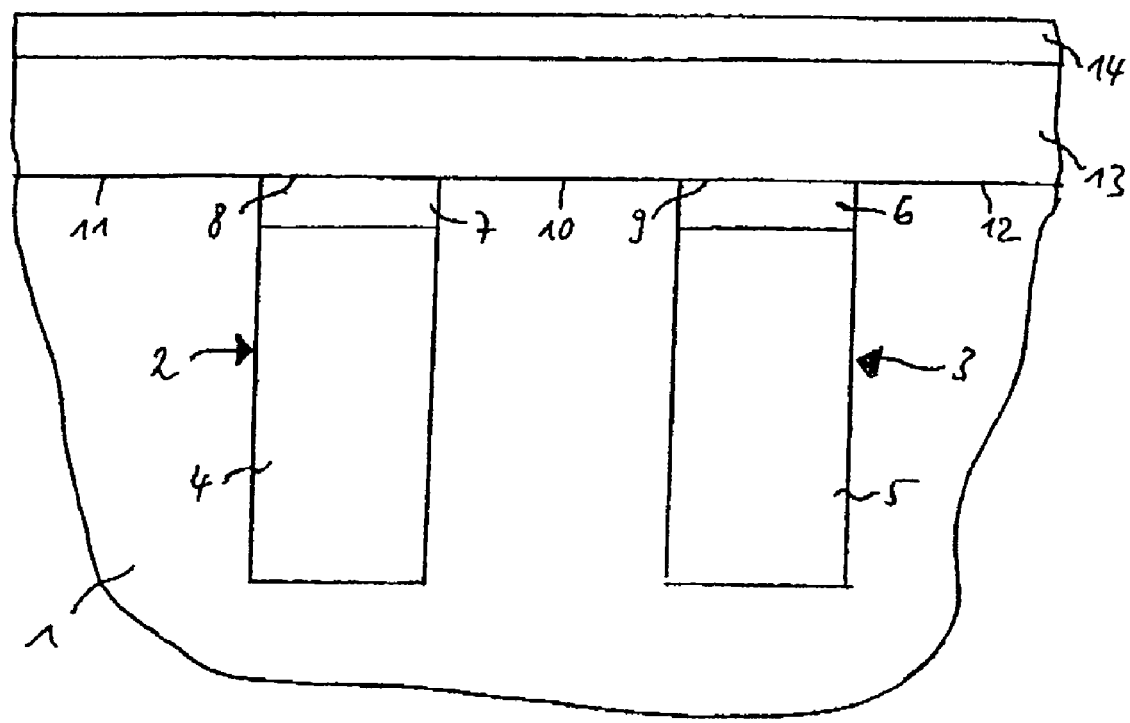

A first trench 2 and a second trench 3 are produced in a silicon substrate 1 (FIG. 1). In this case, the trenches 2 and 3 may be formed for example by a plasma etching process using $HBr/NF_3$. The trenches 2 and 3 have, for example, a depth of 5 µm, a width of 100×250 nm and a mutual distance of 100 nm.

As is already known from the prior art, further layers (not illustrated) can be deposited onto the walls of the trenches 2 and 3 and the trenches 2 and 3 can be filled with polysilicon layers 4 and 5, respectively, which are deposited into the trenches. Reflective layers are deposited onto the polysilicon layers 4 and 5. In this case, as the reflective layers, a metal layer 6 is deposited onto the polysilicon layer 5 and a metal layer 7 is deposited onto the polysilicon layer 4. A planar layer surface is produced by chemical mechanical polishing (CMP) as far as the silicon substrate surface or, for example, as far as an SiN layer that is not illustrated. In this case, the layer surface comprises the reflective surfaces 8 and 9 of the metal layers 7 and 6, respectively, and also the essentially nonreflecting surfaces 10, 11 and 12 of the silicon substrate 1.

In this case, the CMP process is carried out in such a way that deposited metal is removed on the surfaces 10, 11 and 12. The metal layers 7 and 6 deposited onto the polysilicon layers 4 and 5, respectively, are not removed by the CMP process.

Afterward, a light-transmissive layer 13 is deposited onto the layer surface comprising the area regions 8, 9, 10, 11 and 12. Said light-transmissive layer 13 may be, for example, a silicon oxide layer or else a polymer layer made of a photo-insensitive polymer material. A light-sensitive layer is subsequently deposited onto said light-transmissive layer 13. The light-sensitive layer may be, for example, a resist layer 14 or else a multilayer resist system made of one or more light-sensitive resists.

Figure 3:
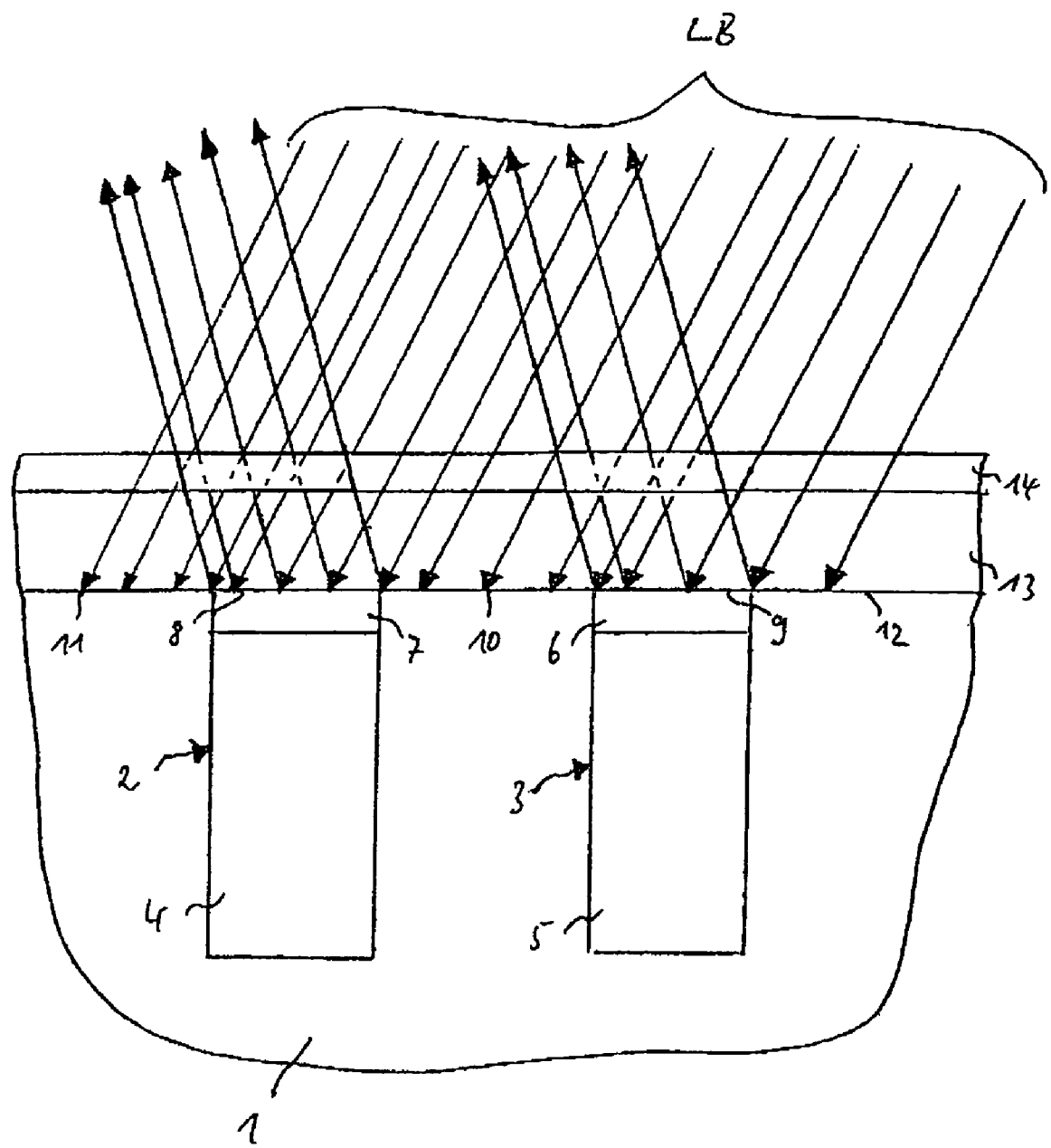

An electromagnetic radiation, which is embodied as a parallel beam LB of light rays in the exemplary embodiment (FIG. 3), is radiated onto the light-sensitive resist layer 14 at an angle $\Theta$ of incidence. In this case, the beam LB of light rays is refracted at the interfaces and passes through the light-sensitive resist layer 14 and the light-transmissive layer 13. That part of the beam LB of light rays which impinges on the area regions 10, 11 and 12 is not reflected. By contrast, that proportion of the beam LB of light rays which impinges on the reflective area regions 8 and 9 is reflected there and passes through the light-transmissive insulation layer 13 and the light-sensitive resist layer 14 again. Both the resist layer 14 and the insulation layer 13 have an absorption coefficient for the incident electromagnetic radiation that is as low as possible. Furthermore, the resist layer 14 is formed in such a way that the resist layer 14 has a threshold value of an irradiation dose which is exceeded only when the resist layer 14 is irradiated with a first irradiation dose of the incident beam LB of light rays and at least with a second irradiation dose of the reflected proportion of the incident beam LB of light rays. As a result, only those regions of the resist layer 14 are exposed which are irradiated with an irradiation dose which lies above the threshold value of the irradiation dose.

Figure 4:
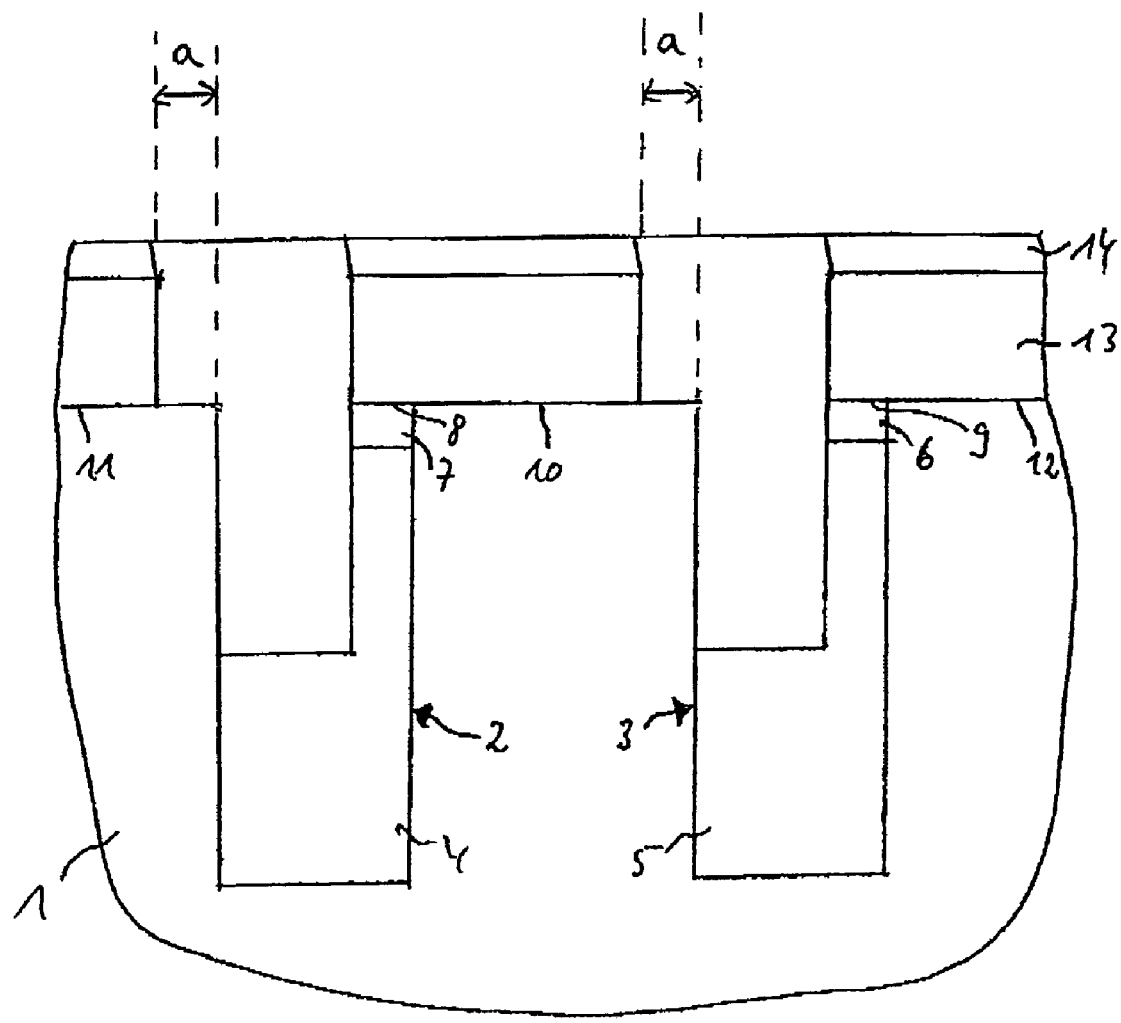

By means of a subsequent development step, those regions of the resist layer 14 which are exposed can be developed and thus removed (FIG. 4). Afterward, those regions of the light-transmissive layer 13 which are arranged vertically below the removed regions of the resist layer 14 are removed by means of an etching process, for example. The light-transmissive insulation layer 13 can subsequently be used as a hard mask for an anisotropic etching of the metal layers 6 and 7 and of the polysilicon layers 5 and 4 of the trenches 3 and 2, respectively. An offset of the structure of the layer surface with the area regions 8, 9, 10, 11 and 12 which corresponds to a distance a is achieved by virtue of the angle $\Theta$ of incidence of the beam LB of light rays. By virtue of the area regions 8, 9, 10, 11 and 12 being arranged horizontally next to one another in a planar manner, the structure of the layer surface is imaged into the resist layer 14 by the beam LB of light rays in a manner virtually true to scale.

Figure 5:
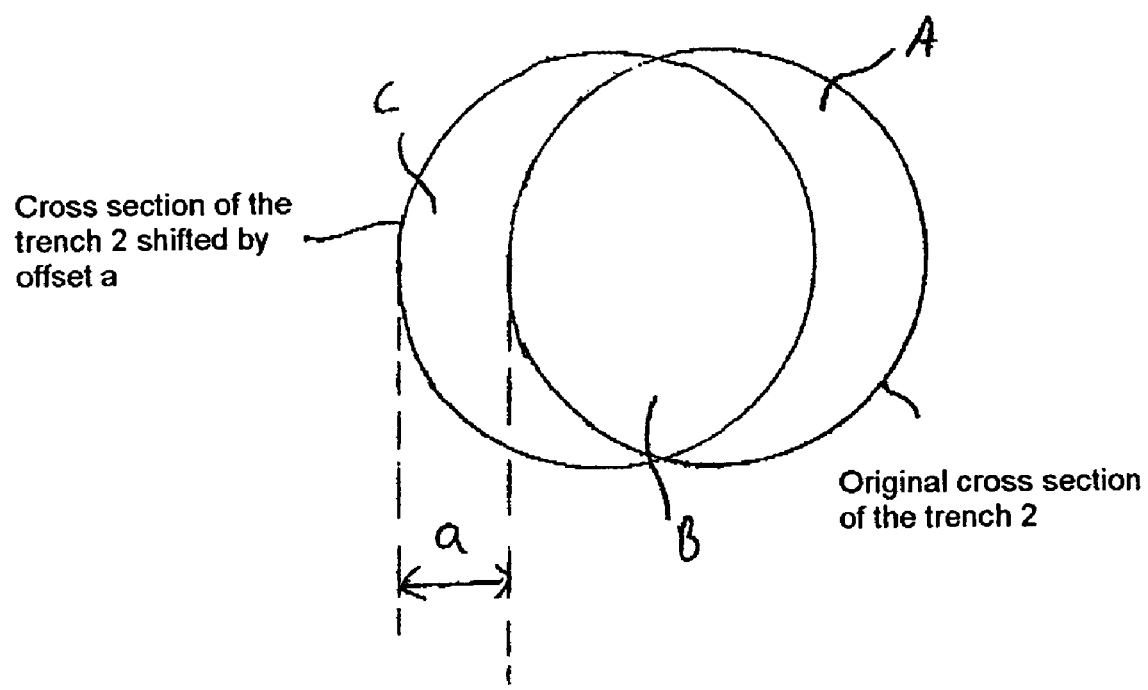
FIG. 5 shows a plan view of the self-aligned structure produced in accordance with FIG. 4.

FIG. 5 illustrates a plan view of the section through the semiconductor wafer which is illustrated in FIG. 4. The trenches 2 and 3 are formed as cylinders in FIGS. 1–4, so that circular areas are illustrated in the plan view in FIG. 5. The circular surface of the trench 2 (FIGS. 1–4) is offset by the distance a in this case. The crescent-shaped area region designated by A shows the region of the resist layer 14 (FIGS. 1–4) which is arranged vertically above the trench 2 and has not been developed, on account of the offset a, and has thus not been removed. The area element B shows the partial region of the entire area cross-section of the trench 2 which is etched on account of the offset a. In accordance with the illustration in FIG. 4, a plan view of the polysilicon layer 4 (FIGS. 1–4) is thus illustrated in the area element B. Furthermore, the view of the surface 11 (FIG. 1–4) of the silicon substrate 1 is illustrated in the crescent-shaped area element C.

In the exemplary embodiment, the trenches 2 and 3 are embodied as cylindrical pillars. It goes without saying that the trenches 2 and 3 can also be embodied in such a way that an oval, a cornered or an arbitrary other geometrical area representation of the surface of the trenches 2 and 3 occurs in a plan view in accordance with FIG. 5.

Figure 6:
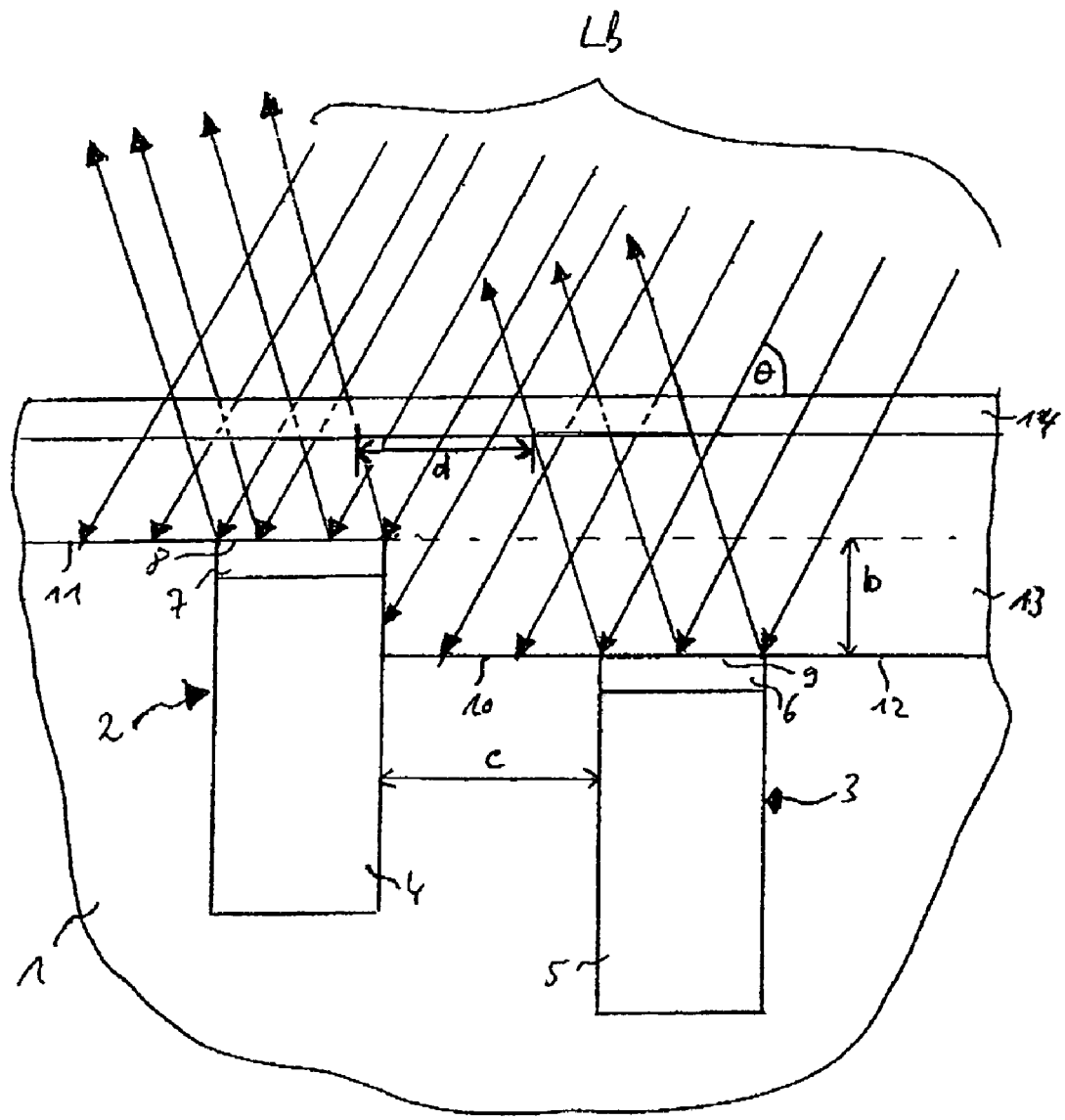
FIG. 6 shows a further exemplary embodiment of a structure of a layer surface.

In a second exemplary embodiment, the trench 3' (FIG. 6) is vertically offset relative to the trench 2 by a distance b. By virtue of the beam LB of light rays being radiated onto the light-sensitive resist layer 14 at the angle $\Theta$ of incidence, the layer surface comprising the area regions 8, 9, 10, 11 and 12 is imaged in the resist layer 14 in accordance with the method carried out from the description relating to FIGS. 1–5. On account of the vertical offset b of the trench 3' relative to the trench 2, the horizontal distance c between the trenches 2 and 3' is represented reduced in the resist layer 14 and has the distance d. Consequently, the structure of the layer surface is represented reduced in size in the resist layer 14. Furthermore, it may also be provided that the surface 8 of the metal layer 7 and/or the surface 9 of the metal layer 6 is embodied in an uneven manner, for example in stepped form. In this case, the metal layer may be made, for example, of aluminum, chromium, nickel or gold. A metal-containing layer made of tungsten silicide may also be embodied as metal layer 7.

Furthermore, provision may also be made, on account of production engineering requirements, for fixedly prescribing the angle $\Theta$ of incidence with which the beam LB of light rays is radiated onto the light-sensitive resist layer 14. A desired offset of the structure of the layer surface of the area regions 8, 9, 10, 11, and 12 will then be achieved by a suitable choice of a refractive index $n_1$ of the insulation layer 13 and/or of a refractive index $n_2$ Of the light-sensitive resist layer 14 and/or of the layer thickness of the insulation layer 13 and/or of the light-sensitive resist layer 14.

Provision may also be made for covering at least a partial region of the light-sensitive resist layer 14 with a protection device in such a way that parts of the beam LB of light rays are absorbed by the protection device or are reflected at said protection device and the remaining part of the beam LB of light rays impinges, for example, on the area regions 8, 10 and 11 (FIGS. 1–4; FIG. 5). What can thereby be achieved is that partial structures of the structure of the layer surface are imaged into the light-sensitive resist layer 14.

It goes without saying that by using a negative resist for the light-sensitive resist layer 14, it is possible to produce a negative of the structure of the layer surface of the area regions 8, 9, 10, 11 and 12 (FIGS. 1–4; FIG. 5).

In the method for fabricating a self-aligned structure on a semiconductor wafer, by radiating a parallel electromagnetic beam of radiation onto a light-sensitive layer with an angle $\Theta$ of incidence, a structure on a layer surface of the semiconductor wafer can be imaged with a lateral offset into the light-sensitive layer. It is thereby possible to achieve, for example, an integration of folded electrodes or the integration of a single-ended electrical connection of a transistor to a capacitor, for example a trench capacitor, in a memory component.

List of Reference Symbols
1 Silicon substrate
2 First trench
3 Second trench
4, 5 Polysilicon layers
6, 7 Metal layers
8, 9, 10, 11, 12 Area regions of the layer surface
13 Light-transmissive layer
14 Resist layer
LB Beam of light rays
$\Theta$ Angle of incidence
A, B, C Area regions
a Offset
b, c, d Distances

The invention claimed is:

1. A method for fabricating a self-aligned structure on a semiconductor wafer, comprising:
    forming a structure on a layer surface of the semiconductor wafer with at least one first area region, at which an electromagnetic radiation is reflected, and at least one second, essentially nonreflecting area region;
    producing a light-transmissive insulation layer at least on the two area regions of the layer surface;
    producing a light-sensitive layer on the light-transmissive insulation layer;
    radiating a parallel electromagnetic beam of rays onto a surface of the light-sensitive layer;
    developing the light-sensitive layer,
wherein
    the parallel electromagnetic beam of rays is directed onto the light-sensitive layer with an angle $\Theta$ of incidence and the angle $\Theta$ of incidence is prescribed such that the structure of the layer surface is imaged with a lateral offset into the light-sensitive layer.

2. The method as claimed in claim 1, wherein
the angle $\Theta$ of incidence is set in a manner dependent on fixedly predetermined layer thicknesses of the insulation layer and/or of the light-sensitive layer and fixedly predetermined refractive indices $n_1$ and/or $n_2$ of the insulation layer and of the light-sensitive layer, respectively.

3. The method as claimed in claim 1, wherein
the layer thicknesses of the insulation layer and/or of the light-sensitive layer and/or the refractive index $n_1$ of the insulation layer and/or the refractive index $n_2$ of the light-sensitive layer is set for a fixedly predetermined angle $\Theta$ of incidence.

4. The method as claimed in claim 1, wherein
a resist layer, having a low absorption coefficient for the electromagnetic radiation which passes through the resist layer, is formed as the light-sensitive layer.

5. The method as claimed in claim 1, wherein
at least one partial area of the light-sensitive layer is covered with a protection device and the incident electromagnetic radiation is reflected and/or absorbed at the protection device.

6. The method as claimed in claim 1,
wherein;
    the light-sensitive layer is produced as a silicon oxide layer or as a layer made of a light-insensitive polymer.

7. The method as claimed in claim 1, wherein
the first area region is formed as a surface of a metal layer or of a metal-containing layer.

8. The method as claimed in claim 7, wherein
aluminum, copper, chromium, nickel or gold is used as the metal and tungsten silicide is used for a metal-containing layer.

* * * * *

UNITED STATES PATENT AND TRADEMARK OFFICE
CERTIFICATE OF CORRECTION

PATENT NO. : 7,041,568 B2  Page 1 of 1
APPLICATION NO. : 10/485307
DATED : May 9, 2006
INVENTOR(S) : Matthias Goldbach et al.

It is certified that error appears in the above-identified patent and that said Letters Patent is hereby corrected as shown below:

On the Cover Page, please insert item [56]: Foreign Priority Data

--DE 101 37 830.0 filed August 2, 2001--

Signed and Sealed this

First Day of May, 2007

JON W. DUDAS
*Director of the United States Patent and Trademark Office*